United States Patent
Baudru et al.

(10) Patent No.: US 9,000,889 B2
(45) Date of Patent: Apr. 7, 2015

(54) METHOD FOR DETERMINING SPURIOUS CONTACTS ON A CONTACT DETECTION SENSOR FOR A DOOR HANDLE OF AN AUTOMOBILE VEHICLE

(75) Inventors: Stephan Baudru, Pins-Justaret (FR); Maxime Cordier, Toulouse (FR); Olivier Elie, Toulouse (FR); Xavier Hourne, Cugnaux (FR)

(73) Assignees: Continental Automotive France, Toulouse (FR); Continental Automotive GmbH, Hannover (DE)

( * ) Notice: Subject to any disclaimer, the term of this patent is extended or adjusted under 35 U.S.C. 154(b) by 224 days.

(21) Appl. No.: 13/818,471

(22) PCT Filed: Aug. 9, 2011

(86) PCT No.: PCT/EP2011/003974
§ 371 (c)(1),
(2), (4) Date: Apr. 2, 2013

(87) PCT Pub. No.: WO2012/031654
PCT Pub. Date: Mar. 15, 2012

(65) Prior Publication Data
US 2013/0194069 A1   Aug. 1, 2013

(30) Foreign Application Priority Data
Sep. 6, 2010 (FR) ...................... 10 03552

(51) Int. Cl.
*G08C 19/00* (2006.01)
*B60R 25/10* (2013.01)
(Continued)

(52) U.S. Cl.
CPC ................. *B60R 25/20* (2013.01); *E05B 81/77* (2013.01); *G07C 2209/65* (2013.01); *H03K 17/962* (2013.01); *H03K 19/00369* (2013.01); *H03K 2217/960705* (2013.01)

(58) Field of Classification Search
USPC ................... 340/5.72, 426.28, 562, 522, 501; 324/679
See application file for complete search history.

(56) References Cited

U.S. PATENT DOCUMENTS
5,880,538 A    3/1999    Schulz
(Continued)

FOREIGN PATENT DOCUMENTS
DE    196 20 059 A1    11/1997
EP    1 584 777 A1    10/2005
(Continued)

OTHER PUBLICATIONS
International Search Report, dated Dec. 29, 2011, from corresponding PCT application.

*Primary Examiner* — George Bugg
*Assistant Examiner* — Munear Akki
(74) *Attorney, Agent, or Firm* — Young & Thompson

(57) ABSTRACT

Method for determining spurious contacts on a contact detection sensor for a handle of an automobile door, the sensor defining a locking area and being connected to an onboard electronic locking and unlocking system, includes:
  a) detecting a contact on the locking area when, for an engagement time of the locking mechanism, the number of charge transfers from the sensor is less than a threshold number of charge transfers,
  b) evaluating the number of charge transfers, starting from the time of the minimum value of the number of measured charge transfers and for an evaluation time in order to distinguish detections of contacts made by the user from detections of spurious contacts,
  c) if the contact detections are spurious, matching the threshold number of charge transfers in order to be able to detect any next contact originating from the user on the locking area in the presence of spurious contacts.

13 Claims, 3 Drawing Sheets

(51) Int. Cl.

| | | |
|---|---|---|
| *G08B 13/26* | (2006.01) | |
| *G08B 19/00* | (2006.01) | |
| *G08B 23/00* | (2006.01) | |
| *G01R 27/26* | (2006.01) | |
| *B60R 25/20* | (2013.01) | |
| *H03K 17/96* | (2006.01) | |
| *H03K 19/003* | (2006.01) | |

(56) References Cited

U.S. PATENT DOCUMENTS

| | | | |
|---|---|---|---|
| 6,236,333 B1 * | 5/2001 | King | 340/5.61 |
| 7,126,453 B2 * | 10/2006 | Sandau et al. | 340/5.61 |
| 2004/0145378 A1 * | 7/2004 | Shoji et al. | 324/663 |
| 2005/0219043 A1 * | 10/2005 | Pollmann et al. | 340/426.28 |
| 2007/0276550 A1 * | 11/2007 | Desai et al. | 701/1 |
| 2008/0290668 A1 * | 11/2008 | Ieda et al. | 292/198 |
| 2011/0210753 A1 * | 9/2011 | Hourne | 324/679 |

FOREIGN PATENT DOCUMENTS

| | | |
|---|---|---|
| WO | 2004/094756 A1 | 11/2004 |
| WO | 2009/068991 A1 | 6/2009 |

* cited by examiner

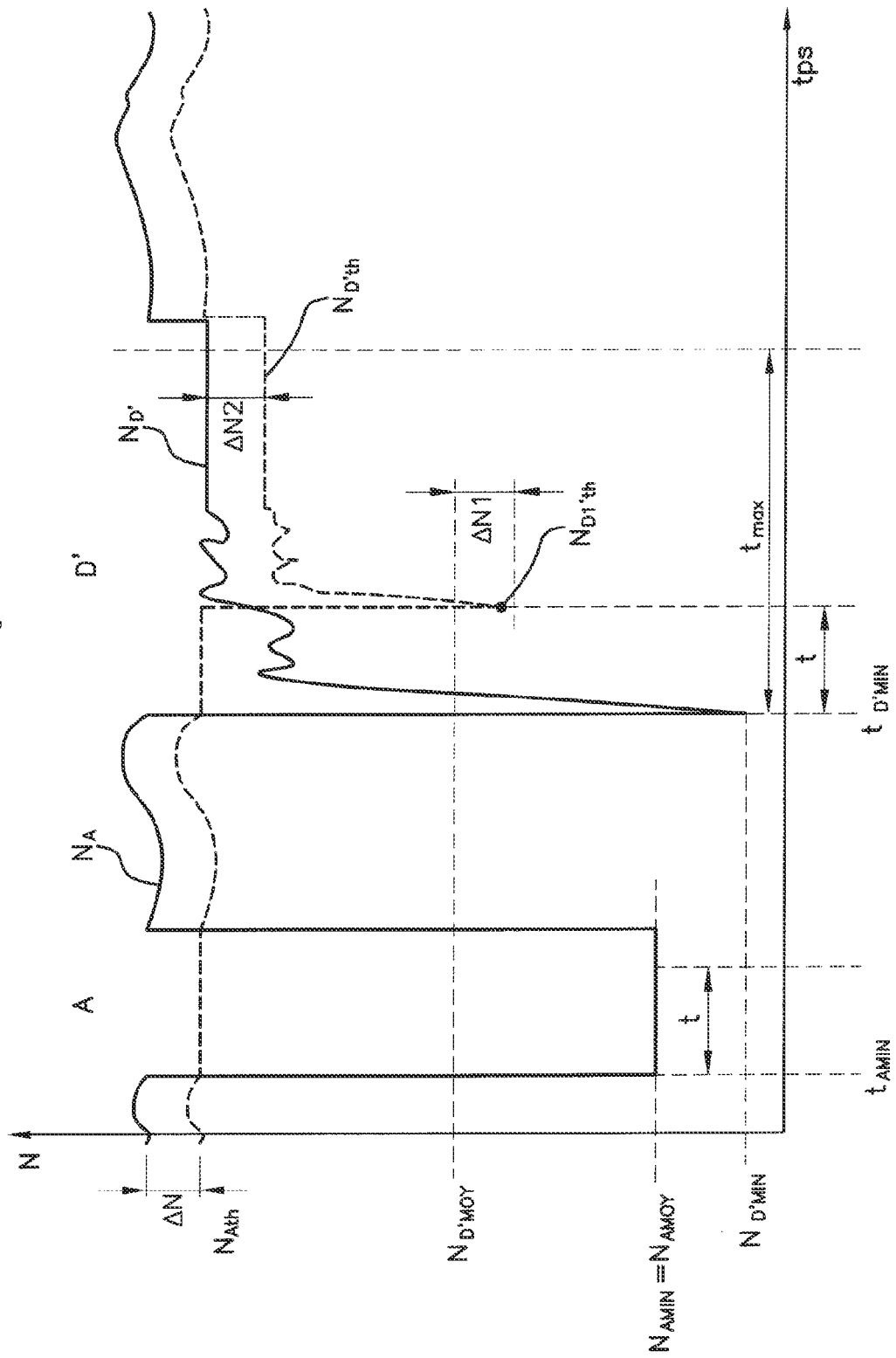

METHOD FOR DETERMINING SPURIOUS CONTACTS ON A CONTACT DETECTION SENSOR FOR A DOOR HANDLE OF AN AUTOMOBILE VEHICLE

The present invention relates to a method for determining spurious contacts on a contact detection sensor for a door handle. The invention is applicable in this case to the field of automobiles.

At the present time, vehicle door handles are equipped with capacitive sensors for detecting the approach and/or the contact of a user. Detecting the approach and/or the contact of a user, coupled with the recognition of a "hands-free" electronic badge for remote access control that he carries, allows the remote locking and unlocking of the opening accesses to the vehicle. Thus, when the user, carrying the corresponding electronic badge identified by the vehicle, touches the door handle of his vehicle, the opening accesses to the vehicle are automatically unlocked. By pressing on a precise location on the door handle of the vehicle, referred to as "unlocking area", the door opens without the need to unlock it manually. Conversely, when the user, again carrying the required badge identified by the vehicle, wishes to lock his vehicle, he closes the door of his vehicle and presses momentarily on another precise location on the handle, referred to as "locking area". This operation allows the opening accesses to the vehicle to be automatically locked.

Some higher-performance locking/unlocking systems allow the user to close all the electric windows of his vehicle when he leaves his vehicle prior to locking it. For this purpose, once the door is closed, he keeps his hand pressed on the locking area of the door handle a few seconds longer, the time required (around 30 s) for closing the windows of his vehicle. The electronic system onboard the vehicle receives this locking command and then coordinates the closing of the windows of the vehicle then locks the vehicle. This mode is referred to as "comfort lock".

Figure 1:
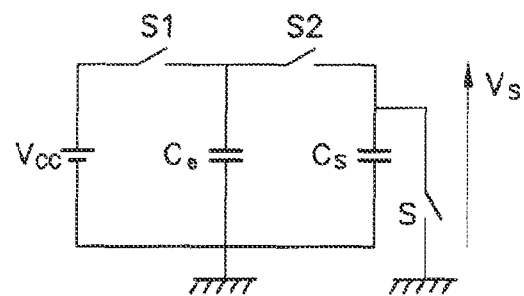

Such systems for locking or unlocking the opening accesses to the vehicle by simple contact of the user on specific areas of the door handle operate in the following manner:

The capacitive sensors, usually integrated into the door handle on the driver's side of a vehicle in the precise locking and unlocking areas, operate by counting the number of charge transfers N from a detection capacitor $C_e$, in the present case a detection electrode, to a storage capacitor $C_s$ with a much higher capacitance (cf. FIG. 1). By means of a power supply voltage $V_{CC}$ and of two switches S1 and S2, the detection electrode $C_e$ charges up, then discharges into the storage capacitor $C_s$ until a threshold voltage value $V_S$ across the terminals of the storage capacitor $C_s$ is reached.

When a user touches these areas, the contact of his hand increases the value of the capacitance of the detection electrode $C_e$. This results in a much lower number of charge transfers N being needed in order to reach the threshold voltage $V_S$ at the terminals of the storage capacitor $C_s$. The new value of the number of charge transfers N is compared with a threshold value $N_{th}$ and, if it is below this value, then the approach and/or contact is detected. The information on approach and/or contact detection, here in this case a contact, together with the duration of this detection are then sent in the form of a signal (with a length according to the detection duration) to the vehicle onboard system controlling the locking/unlocking which triggers the locking or the unlocking.

The number of charge transfers N of these detection sensors is therefore continually compared with a threshold number of charge transfers $N_{th}$ below which the approach and/or contact is detected. It is important to note that, outside of the detection phases, the value of the number of charge transfers N can also vary. This is due to the impact of ambient conditions such as the temperature or the humidity level in the sensor which perturb the capacitance of the detection electrode $C_e$.

The threshold number of charge transfers $N_{th}$ is not a fixed value, and is determined based on the number of charge transfers N measured outside of the detection phases, from which a tolerance $\Delta N$ is removed. This tolerance $\Delta N$ is a fixed number of charge transfers (for example equal to 4, for a value of the number of charge transfers N equal to 900) and has been previously calibrated so as to allow fast and efficient approach and/or contact detections.

Since the number of charge transfers N varies naturally outside of the detection phases (as explained hereinabove) and the threshold number of charge transfers $N_{th}$ is determined from this number N, it accordingly follows that the threshold number of charge transfers $N_{th}$ is not fixed either and varies according to the ambient conditions. However, during detection phases, the threshold number of charge transfers $N_{th}$ is not adapted and during the whole detection phase remains equal to the last value recorded before the detection, in other words before the fall in the number of charge transfers N.

This variation, also referred to as matching, of the threshold number of charge transfers $N_{th}$ is beneficial, since it avoids spurious approach and/or contact detections due for example to the ambient temperature which would make the number of charge transfers N fall below the threshold number of charge transfers $N_{th}$ if the latter is not matched.

This matching is known to those skilled in the art. It is most often carried out using a moving average of the last values of the number of charge transfers N. For example, the charge transfer threshold $N_{th}$ is matched, in other words calculated from the last 32 values of the number of charge transfers N. Since the latter is measured every 60 ms, this is equivalent to a rate of matching of the threshold number of charge transfers $N_{th}$ of around once every 2 seconds.

The particular mode of the comfort locking furthermore operates in the following manner:
  closing of the doors (opening accesses) of the vehicle by the user,
  detection by an onboard electronic system controlling the locking/unlocking of the closed state of all the opening accesses (for example by means of sensors placed on the openings),
  contact by the user on the locking area of the door handle placed on the driver's side of the vehicle,
  maintaining of the contact by the user for a certain period of time (of the order of a few seconds), so as to give the command to the onboard electronic system to engage the comfort locking mode which allows him to close the windows of his vehicle (if he remains in contact for a shorter period than this period of time, then it is the simple locking mode that will be engaged),
  engagement of the comfort locking mode by the electronic system onboard the vehicle controlling the locking/unlocking: the windows close, then, once closed, the onboard electronic system locks the opening accesses to the vehicle.

This comfort locking mode is limited in time; it is considered that the windows are closed within the space of a few tens of seconds (around 30 s), in other words, they easily have time to close if the user keeps pressing for a maximum of 30 s on the locking area.

This maximum duration is calibrated in the contact detection sensor and the charge transfer threshold $N_{th}$ is not matched during these detection phases which can have at the most a duration equal to this maximum duration of 30 s (in the present example). Once this period of time has passed, even if the user keeps pressing on the locking area, the detection sensor reverts to the matching of the threshold number of charge transfers $N_{th}$.

The drawback of these locking and unlocking systems, by the user simply pressing on a precise area of the handle, is the occurrence of spurious contact and/or approach detections on the locking area before the door is even closed and without the user having pressed on the locking area.

Figure 2:
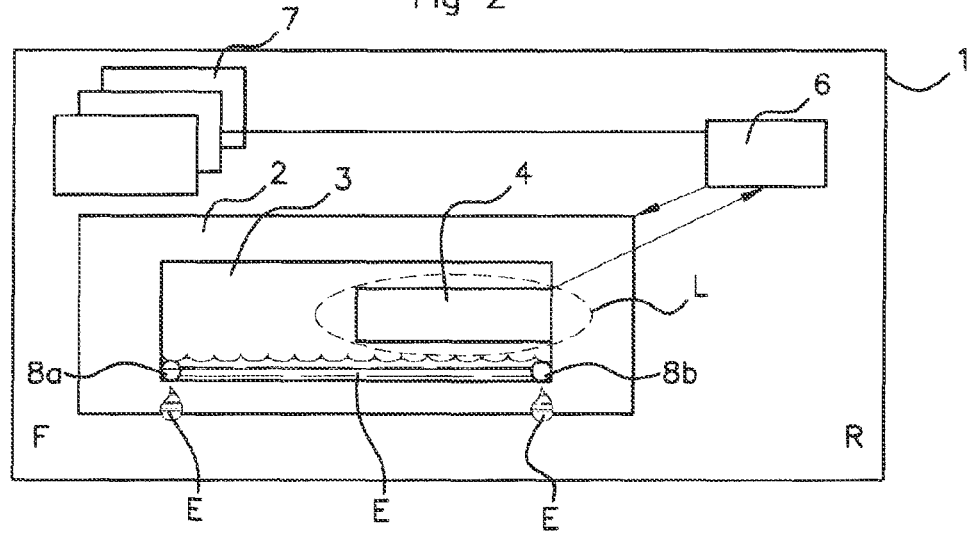
Figure 3:
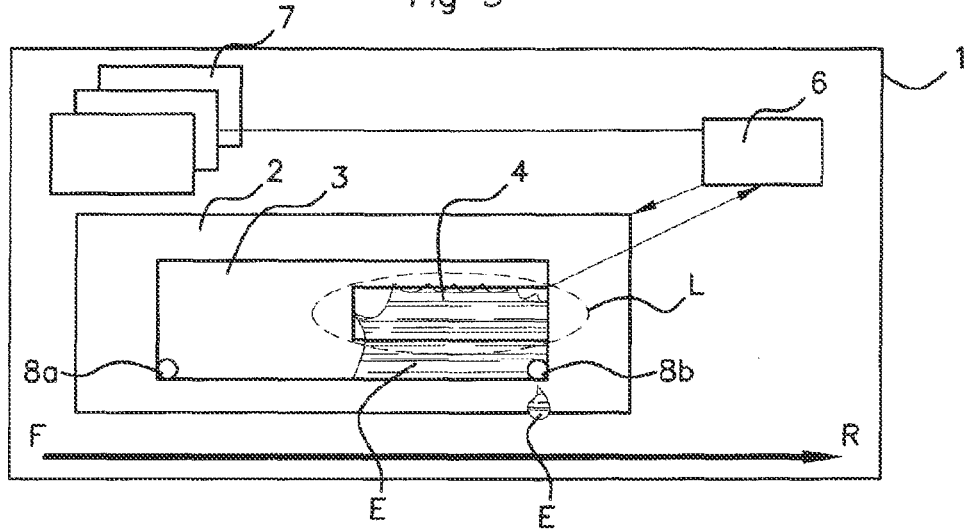

This phenomenon occurs when water of a certain density, in particular salt water mixed with ice or molten snow (known as "slush") mixed with salt, has infiltrated into the handle. This is illustrated in FIGS. 2 and 3. In FIG. 2, a vehicle 1 is shown equipped with windows 7, a door 2 (in this case the door placed on the driver's side of the vehicle) comprising a handle 3 equipped with a contact detection sensor 4. It also comprises an onboard electronic locking/unlocking system 6 connected to the windows 7, to the door 2 and to the detection sensor 4.

The detection sensor 4 defines the locking area L around this sensor 4. The handle 3 is also equipped with holes 8a and 8b for the evacuation of infiltrated water. When water E infiltrates into the handle 3, it stagnates in the lower part of the handle 3, as illustrated in FIG. 2, then slowly runs through the evacuation holes 8a and 8b designed for this purpose. When the user closes his door 2 or slams it, water E is projected onto the detection sensor 4 (cf. FIG. 3). This is because the detection sensor 4 is located at the rear of the handle 3 and by displacement of the water E due to the closing of the door 2, water E is projected in the direction going from the front of the vehicle F toward the rear of the vehicle R, in other words it is projected against the detection sensor 4 and triggers a contact detection on the locking area L. These spurious contact detections happen frequently. The reason for this is that, for the sake of cost reduction and in order to be able to easily change the detection sensor 4 without having to change the entire handle 3, the majority of handles 3 for doors 2 are not watertight.

Moreover, the evacuation holes 8a and 8b provided for evacuating infiltrated water E do not evacuate sufficiently quickly water with a high density of the salt water mixed with ice type. This type of water E may therefore remain for a sufficiently long time in the handle 3 on the detection sensor 4 to trigger spurious contact detections.

Thus, a contact detection occurs before the door 2 is even closed, and without the user having requested it. The information relating to this contact detection on the locking area L is sent to the onboard electronic locking and unlocking system 6 of the vehicle 1 but before the door 2 is even closed. The onboard electronic system 6 is then unaware of this information, which arrived too early, and does not carry out any locking operation, even when the door 2 is finally closed.

In the case of vehicles 1 equipped with the comfort locking mode, if water E persists on the detection sensor 4 for a sufficiently long period of time, then the detection sensor 4 remains in detection mode during this period and the threshold for the number of charge transfers $N_{th}$ is not matched, where this period of time can be equal to the maximum duration of this comfort locking mode 6, in other words 30 s in the present example. No contact detection by the user is therefore possible during this maximum period. If, once the door 2 is closed, the user touches the locking area L, since the detection sensor is already in detection mode (in other words the number of charge transfers N is already below the threshold $N_{th}$), this contact by the user on the sensor will not be detected.

The user stands therefore by his vehicle 1 with the doors 2 closed, that he cannot lock until the maximum duration of the comfort locking mode (30 s) has ended. It will be understood that this situation is very frustrating for the user who believes that there is a fault in the locking system.

Figure 4:
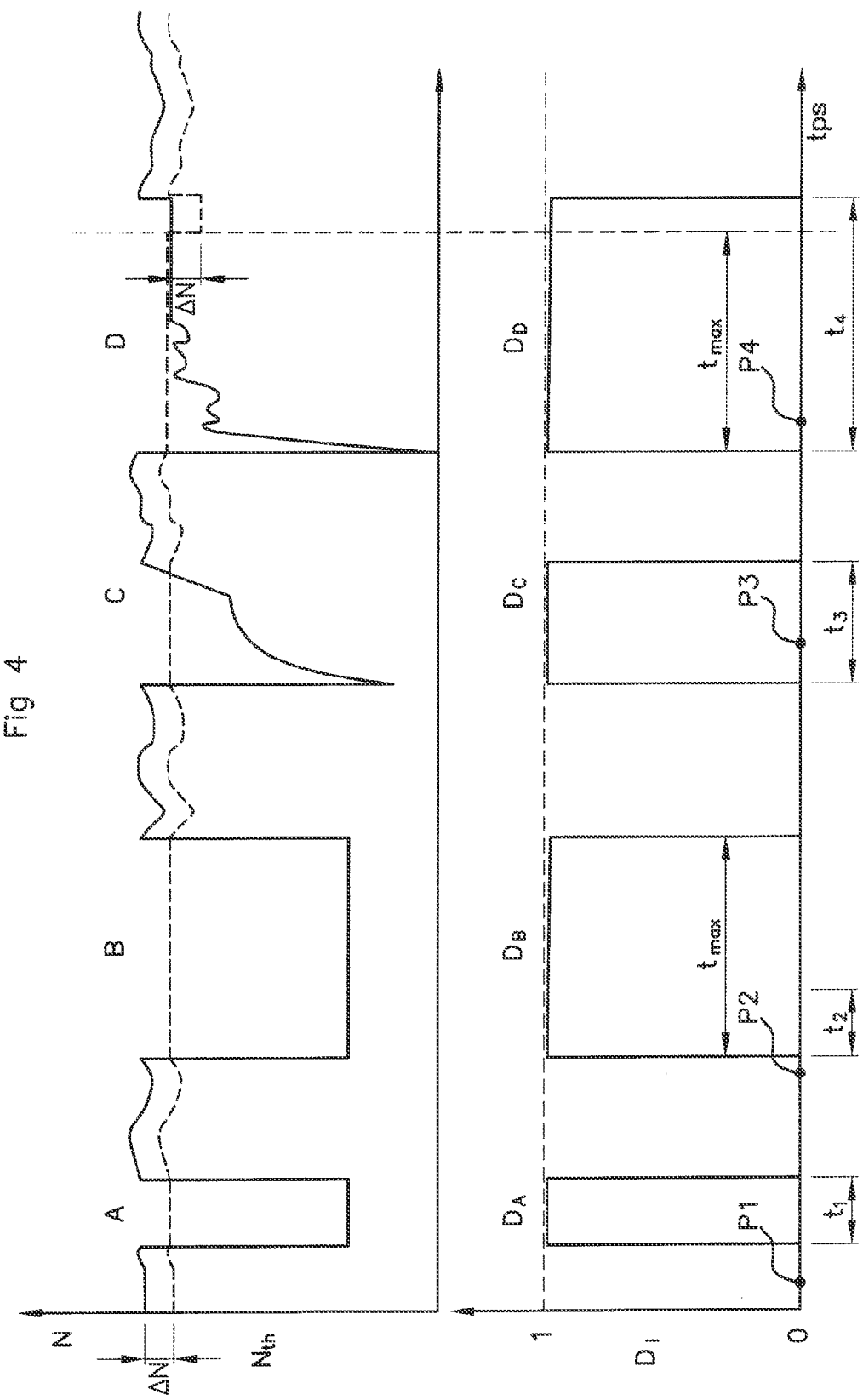

This phenomenon is illustrated in FIG. 4 which shows graphically as a function of the time tps the number of charge transfers N from the detection sensor 4 together with a detection indicator $D_i$, for the following cases:

case A: the door 2 is closed at time P1, the user touches the locking area L for a short period of time $t_1$ corresponding to the duration of engagement of the simple locking mode. The number of charge transfers N falls below the threshold $N_{th}$ and therefore a contact is detected. The detection indicator $D_A$ takes the value 1. The detection information together with its duration are sent to the onboard electronic locking/unlocking system 6 of the vehicle 1 which deduces from this a request for simple locking and then orders this locking.

case B: the door 2 is closed at time P2. The user touches the locking area L for a longer period of time $t_2$. The comfort locking mode is engaged for this period of time $t_2$. In a similar manner to the preceding case A, the number of charge transfers N falls below the threshold for the number of charge transfers $N_{th}$ and hence a contact is detected. The detection indicator $D_B$ takes the value 1. The contact detection information and the contact duration are sent to the onboard electronic locking/unlocking system 6 of the vehicle 1 which then orders the comfort locking. As explained in the prior art, the threshold for the number of charge transfers $N_{th}$ is not matched during this period of time $t_2$ and it conserves its value (which is the last value recorded before the detection). This period of time $t_2$ may be equal to the maximum duration of the comfort locking mode $t_{max}$.

case C: the door 2 is open, water E is projected against the detection sensor 4 when the user closes his door 2. The contact of water E on the detection sensor 4 makes the number of charge transfers N fall momentarily below the threshold for the number of charge transfers $N_{th}$ and hence a contact is detected on the locking area L while the door 2 is not yet closed, in other words prior to the time P3 of closing of the door 3. The detection indicator $D_C$ takes the value 1. In this case, water E is able to flow through the evacuation holes 8a and 8b for a period of time $t_3$. Although this period of time is relatively short, this is still detrimental to the user because he is unable to lock his vehicle 1 starting from the time P3 and until the period of time $t_3$ has passed.

case D: the door 2 is open. As for the preceding case, water E is projected against the detection sensor 4 when the user closes his door 2. The contact of water E on the detection sensor 4 makes the number of charge transfers N fall below the charge transfer threshold $N_{th}$ and hence a detection is made prior to the closing of the door at time P4. The detection indicator $D_D$ takes the value 1. In this specific case, water E stagnates on the detection sensor 4 and is not able to run away sufficiently quickly, in other words it subsists on the detection sensor 4 for the whole period of time $t_4$. If this period of time $t_4$ is equal to the maximum duration of the comfort locking mode, the user can no longer lock his vehicle until this maximum duration $t_{max}$ of this mode, which is relatively long (30 s in the present example), has ended. Indeed, the number of charge transfers N is already below the threshold number $N_{th}$, and as the latter is not matched during this maximum period $t_{max}$, no other contact detection (in this case that originating from the user) is possible.

The aim of the present invention is therefore to provide a method for determining spurious contacts on a contact detection sensor of a door handle allowing a contact on the sensor originating from a spurious phenomenon to be distinguished, in this case due to the presence of water, from a contact originating from the user. The purpose is to allow the user to lock his car even in the presence of water on the detection sensor. This method is particularly applicable to vehicles equipped with the comfort locking mode.

The method for determining spurious contacts on a contact detection sensor of a door handle of an automobile vehicle, said detection sensor defining a locking control area and being connected to an onboard electronic locking and unlocking system, comprises:
  a) the detection of a contact on the locking area of the detection sensor, when, for an engagement time of the locking mechanism, the number of charge transfers from the detection sensor is less than a threshold number,
the method furthermore comprising the following steps:
  b) the evaluation of the number of charge transfers, starting from the time of the minimum value of the number of measured charge transfers and for an evaluation time in order to distinguish the detections of contacts made by the user from the detections of spurious contacts,
  c) if the contact detections are spurious contact detections, the matching of the threshold number of charge transfers in order to be able to detect any next contact originating from the user on the locking area in the presence of spurious contacts.

The method for determining spurious contacts according to the invention provides, during the step b, for the evaluation of the number of charge transfers to be carried out in the following manner:
  recording of the minimum value of the number of charge transfers reached during the contact detection and of the time corresponding to this value,
  starting from this time, calculation of the average of the number of charge transfers over an evaluation period of time,
  comparison between the minimum value of the number of recorded charge transfers and the calculated average value,
  if the calculated average value is equal to the recorded minimum value, then the contact detection originates from the user,
  if the calculated average value is greater than the recorded minimum value, then the contact detection originates from a spurious contact.

Advantageously, during the step c, the invention provides for the matching of the threshold number of charge transfers to be carried out in the following manner:
  once the evaluation time t has passed, the first value of the threshold number of charge transfers is calculated based on the average of the number of charge transfers calculated over the predetermined evaluation time from which a first tolerance has been removed,
  the following values of the threshold number of charge transfers are calculated based on a moving average of the number of charge transfers from which a second tolerance has been removed.

In one variant embodiment of the invention, the first tolerance and the second tolerance are equal.

Judiciously, the evaluation time is less than the duration of engagement of the locking mode.

In one embodiment of the invention, the steps a, b and c are carried out by the detection sensor. Alternatively, they can be carried out by the onboard electronic locking/unlocking system of the vehicle.

The invention also relates to an automobile vehicle incorporating a device implementing the method for determining spurious contacts described hereinabove.

Other subjects, features and advantages of the invention will become apparent upon reading the description that follows by way of non-limiting example and upon examining the appended drawings in which:

FIG. 1 shows a schematic view of a capacitive sensor for approach and/or contact detection which has already been explained, FIG. 2 shows a schematic view of infiltration of water into a door handle of a vehicle equipped with an approach and/or contact detection sensor which has previously been explained, FIG. 3 shows a schematic view of the phenomenon of spurious contact detection due to the projection of water infiltrated onto the approach and/or contact detection sensor during the closing of the door which has already been explained previously, FIG. 4 has already been explained previously and shows graphically the contact detection for several cases:
  a contact detection for a simple locking,
  a contact detection in the case of a comfort locking,
  a false contact detection due to the presence of water, with a short duration,
  together with a false contact detection due to the presence of water with a duration equal to the maximum duration for the comfort locking mode.

FIG. 5 shows graphically the method for determining the spurious contacts on the contact detection sensor, according to the invention.

According to the invention, the method for determining spurious contacts on the detection sensor 4 situated in the handle 3 of a door 2 of the vehicle 1, illustrated in FIG. 5, includes:
  the evaluation, with regards to the time, of the number of charge transfers $N_A$, $N_D$, during a detection, in order to distinguish the contact detections originating from the user from the "spurious" contact detections originating from infiltrated water E then,
  if the contact detections originate from infiltrated water E, the matching of the threshold for the number of charge transfers $N_{D'th}$ so as to no longer inhibit the contact detections originating from the user during the presence of water E in the handle 3.

For this purpose, when the number of charge transfers $N_A$, $N_D$, falls below the threshold $N_{Ath}$, and hence when a contact is detected on the locking area ($D_i=1$), the invention includes the following steps:
  recording of the minimum value of the number of charge transfers $N_{AMIN}$, $N_{D'MIN}$ reached and of the time corresponding to this value $t_{AMIN}$, $t_{D'MIN}$,
  starting from this time, $t_{AMIN}$, $t_{D'MIN}$, calculation of the average of the number of charge transfers $N_{AMOY}$, $N_{D'MOY}$ over a predetermined evaluation time t,
  if the average of the number of charge transfers $N_{AMOY}$ is approximately equal (to a given tolerance) to the minimum value of the number of charge transfers reached $N_{AMIN}$, then the contact detection originates from the user and the threshold number of charge transfers $N_{Ath}$ is not matched, if the average of the number of charge transfers $N_{D'MOY}$ is greater than the minimum value of the number of charge transfers $N_{D'MIN}$ reached, then the contact detection is "spurious" and, in the present example, originates from infiltrated water E. In this case, the invention provides for the charge transfer threshold $N_{D'th}$ to be matched in order to be able to detect any next contact originating from the user on the locking area.

The matching provided is as follows:

the first value of the threshold number of charge transfers $N_{D1'th}$, once the evaluation time t has passed, is calculated based on the average of the number of charge transfers $N_{D'MOY}$ calculated over the predetermined evaluation time t from which a first tolerance has been removed $\Delta N1$. The value of the first tolerance $\Delta N1$ can be equal to that of the prior art $\Delta N$ (in other words equal to 4 in the present example), or can be redefined, the following values of the threshold number of charge transfers $N_{D'th}$ are calculated based on a moving average of the number of measured charge transfers $N_{D'}$ from which a second tolerance has been removed $\Delta N2$.

In one particular embodiment, the first and second tolerances $\Delta N1$ and $\Delta N2$ are equal.

The predetermined evaluation time t of the average value of the number of charge transfers $N_{AMOY}$, $N_{AMOY}$ is of course much shorter than the duration of engagement of the comfort locking mode $t_2$. In one embodiment, the predetermined evaluation time t is less than the duration of engagement of the simple locking mode $t_1$ in order to detect as quickly as possible any erroneous contact detection due to water infiltrated without the user being affected.

FIG. 5 illustrates the method according to the invention together with its advantages:

for the case A, the minimum value of the number of charge transfers $N_{AMIN}$ reached at time $t_{AMIN}$ is equal to the average value of the number of charge transfers $N_{AMOY}$ starting from this time $t_{AMIN}$ for the evaluation period of time t. Consequently, the contact detection originates from the action of the user on the detection sensor 4, and the threshold for the number of charge transfers $N_{Ath}$ is not matched during the detection, which corresponds to the prior art, for the case D', the minimum value of the number of charge transfers $N_{D'MIN}$ reached at time $t_{D'MIN}$ is much less than the average value of the number of charge transfers $N_{D'MOY}$ calculated from this time $t_{D'MIN}$ during the evaluation period of time t. Consequently, the contact detection originates from the action of water E projected onto the detection sensor 4 during the closing of the door 2 by the user. According to the invention, the threshold for the number of charge transfers $N_{D'th}$ is then matched using the average of the number of charge transfers $N_{D'MOY}$ calculated from the start of the detection. Thus, the matched threshold number of charge transfers $N_{D'th}$ is lower than the threshold number of charge transfers $N_{Dth}$ (cf. FIG. 4) of the prior art and is of course below the number of charge transfers $N_{D'}$ measured during the detection. Any next contact of the user on the locking area L will automatically be detected because it will make the number of charge transfers $N_{D'}$ fall below the matched threshold number of charge transfers $N_{D'th}$ which is lower than that of the prior art (i.e: $N_{Dth}$).

It is important to note that the determination of a false contact detection on the sensor due to a spurious phenomenon together with the matching of the threshold number of charge transfers $N_{th}$ resulting from this are calculations performed in the software of the detection sensor and do not require any additional component. The present invention therefore has the advantage of having a very low cost.

In the case where the detection sensor does not possess electronics that are sufficient for incorporating the invention, for example in the case where the detection sensor only transmits the number of charge transfers N to the onboard electronic system (the latter being equipped for comparing this value with a threshold number of charge transfers $N_{th}$ that it has in memory and thus determining the detection phases), then the invention will be implemented in the software of the electronic onboard system of the vehicle itself.

The invention therefore provides for determining the contact detections on the locking area originating from the action of water on the detection sensor then for matching the threshold number of charge transfers during this detection, so that the latter is less than the measured number of charge transfers, and is thus able to detect any next contact by the user on the locking area. Since the threshold for contact detection is thus lowered even in the presence of water on the sensor, the user can lock his car at any time and is no longer in the presence of a car whose doors are closed and that he can no longer lock, as in the prior art.

It goes without saying that the invention is not limited to the problem of the projection of water onto the detection sensor inside the handle and may also be applied to any other spurious phenomenon which creates a false contact detection by the sensor, for example ice projected onto the locking area outside of the handle when the user closes his door.

The invention claimed is:

1. A method for determining spurious contacts on a contact detection sensor (4) for a handle (3) of a door (2) of an automobile vehicle (1), said detection sensor (4) defining a locking control area (L) and being connected to an onboard electronic locking and unlocking system (6), said method comprising:

a) the detection of a contact on the locking area (L) of the detection sensor (4), when, for an engagement time ($t_1$, $t_2$) of the locking mechanism, the number of charge transfers (N) from the detection sensor (4) is less than a threshold number of charge transfers ($N_{th}$), characterized in that the method furthermore comprises the following steps:

b) evaluation of the number of charge transfers ($N_{D'}$), starting from the time of the minimum value ($t_{D'MIN}$) of the number of measured charge transfers and for an evaluation time (t) in order to distinguish the detections of contacts made by the user from the detections of spurious contacts, c) if the contact detections are spurious contact detections, matching of the threshold number of charge transfers ($N_{D'th}$) in order to be able to detect any next contact originating from the user on the locking area (L) in the presence of spurious contacts.

2. The method for determining spurious contacts as claimed in claim 1, characterized in that, during the step b, the evaluation of the number of charge transfers ($N_{D'}$) is carried out in the following manner:

recording of the minimum value of the number of charge transfers ($N_{D'MIN}$) reached during the contact detection and of the time corresponding to this value ($t_{D'MIN}$), starting from this time ($t_{D'MIN}$), calculation of the average of the number of charge transfers ($N_{D'MOY}$) over an evaluation period of time (t), comparison between the minimum value of the number of recorded charge transfers ($N_{D'MIN}$) and the calculated average value ($N_{D'MOY}$), if the calculated average value ($N_{D'MOY}$) is equal to the recorded minimum value ($N_{D'MIN}$), then the contact detection originates from the user, if the calculated average value ($N_{D'MOY}$) is greater than the recorded minimum value ($N_{D'MIN}$), then the contact detection originates from a spurious contact.

3. The method for determining spurious contacts as claimed in claim 1, characterized in that, during the step c, the matching of the threshold number of charge transfers ($N'_{Dth}$) is carried out in the following manner:

the first value of the threshold number of charge transfers ($N_{D'1th}$), once the evaluation time (t) has passed, is calculated based on the average of the number of charge transfers ($N_{DMOY}$) calculated over the predetermined evaluation time (t) from which a first tolerance has been removed ($\Delta N1$), the following values of the threshold number of charge transfers ($N_{D'th}$) are calculated based on a moving average of the number of charge transfers ($N_{D'}$) from which a second tolerance ($\Delta N2$) has been removed.

4. The method for determining spurious contacts as claimed in claim 1 claim 3, characterized in that the first tolerance ($\Delta N1$) and the second tolerance ($\Delta N2$) are equal.

5. The method for determining spurious contacts as claimed in claim 1, characterized in that the evaluation time (t) is less than the duration of engagement of the locking mode ($t_1$, $t_2$).

6. The method for determining spurious contacts as claimed in claim 1, characterized in that the steps a, b and c are carried out by the detection sensor (4).

7. The method for determining spurious contacts as claimed in claim 1, characterized in that the steps a, b and c are carried out by the onboard electronic locking/unlocking system (6) of the vehicle (1).

8. An automobile vehicle (1) incorporating a device implementing the method for determining spurious contacts as claimed in claim 1.

9. The method for determining spurious contacts as claimed in claim 2, characterized in that, during the step c, the matching of the threshold number of charge transfers ($N'_{Dth}$) is carried out in the following manner:

the first value of the threshold number of charge transfers ($N_{D'1th}$), once the evaluation time (t) has passed, is calculated based on the average of the number of charge transfers ($N_{DMOY}$) calculated over the predetermined evaluation time (t) from which a first tolerance has been removed ($\Delta N1$), the following values of the threshold number of charge transfers ($N_{D'th}$) are calculated based on a moving average of the number of charge transfers ($N_{D'}$) from which a second tolerance ($\Delta N2$) has been removed.

10. The method for determining spurious contacts as claimed in claim 9, characterized in that the first tolerance ($\Delta N1$) and the second tolerance ($\Delta N2$) are equal.

11. The method for determining spurious contacts as claimed in claim 2, characterized in that the evaluation time (t) is less than the duration of engagement of the locking mode ($t_1$, $t_2$).

12. The method for determining spurious contacts as claimed in claim 2, characterized in that the steps a, b and c are carried out by the detection sensor (4).

13. The method for determining spurious contacts as claimed in claim 2, characterized in that the steps a, b and c are carried out by the onboard electronic locking/unlocking system (6) of the vehicle (1).

* * * * *